(12) United States Patent
Mizumura

(10) Patent No.: US 10,840,095 B2
(45) Date of Patent: Nov. 17, 2020

(54) LASER IRRADIATION DEVICE, THIN-FILM TRANSISTOR AND THIN-FILM TRANSISTOR MANUFACTURING METHOD

(71) Applicant: V Technology Co., Ltd., Yokohama (JP)

(72) Inventor: Michinobu Mizumura, Yokohama (JP)

(73) Assignee: V Technology Co., Ltd., Yokohama (JP)

( * ) Notice: Subject to any disclaimer, the term of this patent is extended or adjusted under 35 U.S.C. 154(b) by 0 days.

(21) Appl. No.: 16/451,476

(22) Filed: Jun. 25, 2019

(65) Prior Publication Data
US 2019/0311899 A1 Oct. 10, 2019

Related U.S. Application Data

(63) Continuation of application No. PCT/JP2017/047038, filed on Dec. 27, 2017.

(30) Foreign Application Priority Data

Dec. 28, 2016 (JP) .................................. 2016-255690

(51) Int. Cl.
*H01L 21/00* (2006.01)
*H01L 21/02* (2006.01)
(Continued)

(52) U.S. Cl.
CPC ........ *H01L 21/02675* (2013.01); *H01L 21/20* (2013.01); *H01L 21/268* (2013.01);
(Continued)

(58) Field of Classification Search
CPC . H01L 21/02675; H01L 29/786; H01L 21/20; H01L 21/268; H01L 21/67115;
(Continued)

(56) References Cited

U.S. PATENT DOCUMENTS 6,906,346 B2 * 6/2005 Nishitani ............ H01L 21/2026
257/70
7,300,858 B2 * 11/2007 Im ........................ B23K 26/067
438/487
(Continued)

FOREIGN PATENT DOCUMENTS

JP 2002-324759 A 11/2002
JP 2005-536874 A 12/2005
(Continued)

OTHER PUBLICATIONS

International Search Report dated Apr. 3, 2018, of counterpart International Application No. PCT/JP2017/047038, along with an English translation.

*Primary Examiner* — Vu A Vu
(74) *Attorney, Agent, or Firm* — DLA Piper LLP (US)

(57) ABSTRACT

A laser irradiation device includes a light source that generates a laser beam, a projection lens that irradiates a predetermined region of an amorphous silicon thin film, mounted on each of a plurality of thin-film transistors on a glass substrate moving in a predetermined direction, with the laser beam, and a projection mask pattern provided on the projection lens and has a plurality of columns each including a predetermined number of opening portions and provided parallel to the predetermined direction, in which the projection lens emits the laser beam through the projection mask pattern, and the projection mask pattern is configured such that at least some of the predetermined number of opening portions are not on a straight line parallel to the predetermined direction in each of the plurality of columns.

18 Claims, 10 Drawing Sheets

(51) Int. Cl.
  *H01L 21/268* (2006.01)
  *H01L 21/67* (2006.01)
  *H01L 29/786* (2006.01)
  *H01L 21/20* (2006.01)
  *G02B 3/00* (2006.01)

(52) U.S. Cl.
  CPC ...... *H01L 21/67115* (2013.01); *H01L 29/786* (2013.01); *G02B 3/0056* (2013.01)

(58) Field of Classification Search
  CPC ............ H01L 27/1288; H01L 27/1285; H01L 21/02678; H01L 21/0268; H01L 21/02532; H01L 21/02422; H01L 21/02691; G02B 3/0056
  USPC ........................................................ 438/486
  See application file for complete search history.

(56) References Cited

U.S. PATENT DOCUMENTS

| | | | |
|---|---|---|---|
| 7,740,993 B2* | 6/2010 | Sun | ................... H01L 21/02532 430/22 |
| 8,486,812 B2* | 7/2013 | Park | ........................ C30B 13/22 438/487 |
| 8,507,156 B2* | 8/2013 | Park | ........................ C30B 1/023 430/5 |

FOREIGN PATENT DOCUMENTS

| | | |
|---|---|---|
| JP | 2009-32903 A | 2/2009 |
| JP | 2010-283073 A | 12/2010 |
| JP | 2016-100537 A | 5/2016 |

* cited by examiner

LASER IRRADIATION DEVICE, THIN-FILM TRANSISTOR AND THIN-FILM TRANSISTOR MANUFACTURING METHOD

RELATED APPLICATIONS

This is a continuation of International Application No. PCT/JP2017/047038, with an international filing date of Dec. 27, 2017, which is based on Japanese Patent Application No. 2016-255690, filed Dec. 28, 2016, the entire contents of which are incorporated herein by reference.

TECHNICAL FIELD

This disclosure relates to formation of a thin-film transistor, more particularly, to a laser irradiation device, a thin-film transistor and a thin-film transistor manufacturing method of forming a polysilicon thin film by irradiating an amorphous silicon thin film on the thin-film transistor with a laser beam.

BACKGROUND

There is a thin-film transistor having an inverted staggered structure in which an amorphous silicon thin film is used for a channel region. However, since an amorphous silicon thin film has low electron mobility, using the amorphous silicon thin film for a channel region results in a disadvantage in that the mobility of electrons in a thin-film transistor is reduced.

Consequently, there is a technique in which a predetermined region of an amorphous silicon thin film is instantaneously heated by a laser beam such that it is formed into a polycrystal so that a polysilicon thin film having a high electron mobility is formed and used for a channel region.

For example, Japanese Unexamined Patent Application Publication No. 2016-100537 discloses that a process of crystallizing a polysilicon thin film through melting and solidification for a short period of time is performed by forming an amorphous silicon thin film in a channel region and then irradiating the amorphous silicon thin film with a laser beam such as an excimer laser to perform laser annealing on the amorphous silicon thin film. JP '537 discloses that a channel region between a source and a drain of the thin-film transistor can be formed into a polysilicon thin film having a high electron mobility by performing the process, and high-speed operation of the transistor can be achieved.

In the thin-film transistor disclosed in JP '537, the channel region between the source and the drain is formed by one (single) polysilicon thin film. For this reason, the characteristics of the thin-film transistor depend on one (single) polysilicon thin film.

Since the energy density of a laser beam such as an excimer laser varies for each irradiation (shot), the electron mobility of a polysilicon thin film formed using the laser beam also varies. For this reason, the characteristics of the thin-film transistor formed using the polysilicon thin film also depend on variation in the energy density of the laser beam.

As a result, there is a possibility that characteristics of a plurality of thin-film transistors included in a glass substrate may become unstable.

It could therefore be helpful to provide a laser irradiation device, a thin-film transistor and a thin-film transistor manufacturing method capable of suppressing variations in the characteristics of a plurality of thin-film transistors included in a glass substrate.

SUMMARY

We thus provide:

A laser irradiation device includes a light source that generates a laser beam, a projection lens that irradiates a predetermined region of an amorphous silicon thin film, which is mounted on each of a plurality of thin-film transistors on a glass substrate moving in a predetermined direction, with the laser beam, and a projection mask pattern provided on the projection lens and has a plurality of columns each including a predetermined number of opening portions and provided parallel to the predetermined direction, in which the projection lens emits the laser beam through the projection mask pattern, and the projection mask pattern is configured such that at least some of the predetermined number of opening portions are not allocated on a straight line parallel to the predetermined direction in each of the plurality of columns.

The projection mask pattern may be configured such that each of the predetermined number of opening portions is allocated on a predetermined waveform having a predetermined period in each of the plurality of columns.

The projection mask pattern may be configured such that each of the predetermined number of opening portions is allocated on substantially a sine wave in each of the plurality of columns.

The projection lens may be a microlens array having a plurality of columns each including a predetermined number of microlenses and provided parallel to the predetermined direction, and the microlens array may be configured such that at least some of the predetermined number of microlenses are not on a straight line parallel to the predetermined direction in each of the plurality of columns.

The microlens array may be configured such that each of the predetermined number of microlenses is on a predetermined waveform having a predetermined period in each of the plurality of columns.

The microlens array may be configured such that each of the predetermined number of microlenses is on a substantially sine wave in each of the plurality of columns.

Microlenses adjacent to each other and included in one column may be disposed to be shifted from each other by a predetermined distance in the microlens array, and the predetermined distance may be a natural number multiple of an interval between the amorphous silicon thin films on the glass substrate.

The light source may repeatedly irradiate the amorphous silicon thin films included in one column on the glass substrate with a laser beam a predetermined number of times using the microlens array.

The light source may move the microlens array in a direction perpendicular to the one column by a predetermined phase of the predetermined waveform whenever the amorphous silicon thin films included in the one column on the glass substrate are repeatedly irradiated with a laser beam.

The projection lens may form a polysilicon thin film by irradiating a predetermined region of an amorphous silicon thin film mounted between a source electrode and a drain electrode included in a thin-film transistor with a laser beam.

A thin-film transistor manufacturing method includes a first step of generating a laser beam, and a second step of irradiating a predetermined region of an amorphous silicon thin film, which is mounted on each of a plurality of thin-film transistors on a glass substrate moving in a predetermined direction, with the laser beam, in which in the second step, the laser beam is emitted using a projection mask pattern provided on the projection lens and has a plurality of columns each including a predetermined number of opening portions and provided parallel to the predetermined direction, and the projection mask pattern is configured such that at least some of the predetermined number of opening portions are not on a straight line parallel to the predetermined direction in each of the plurality of columns.

A laser irradiation device, a thin-film transistor and a thin-film transistor manufacturing method capable of suppressing variation in characteristics a plurality of thin-film transistors included in a glass substrate are thus provided.

REFERENCE SIGNS LIST

Figure 1:
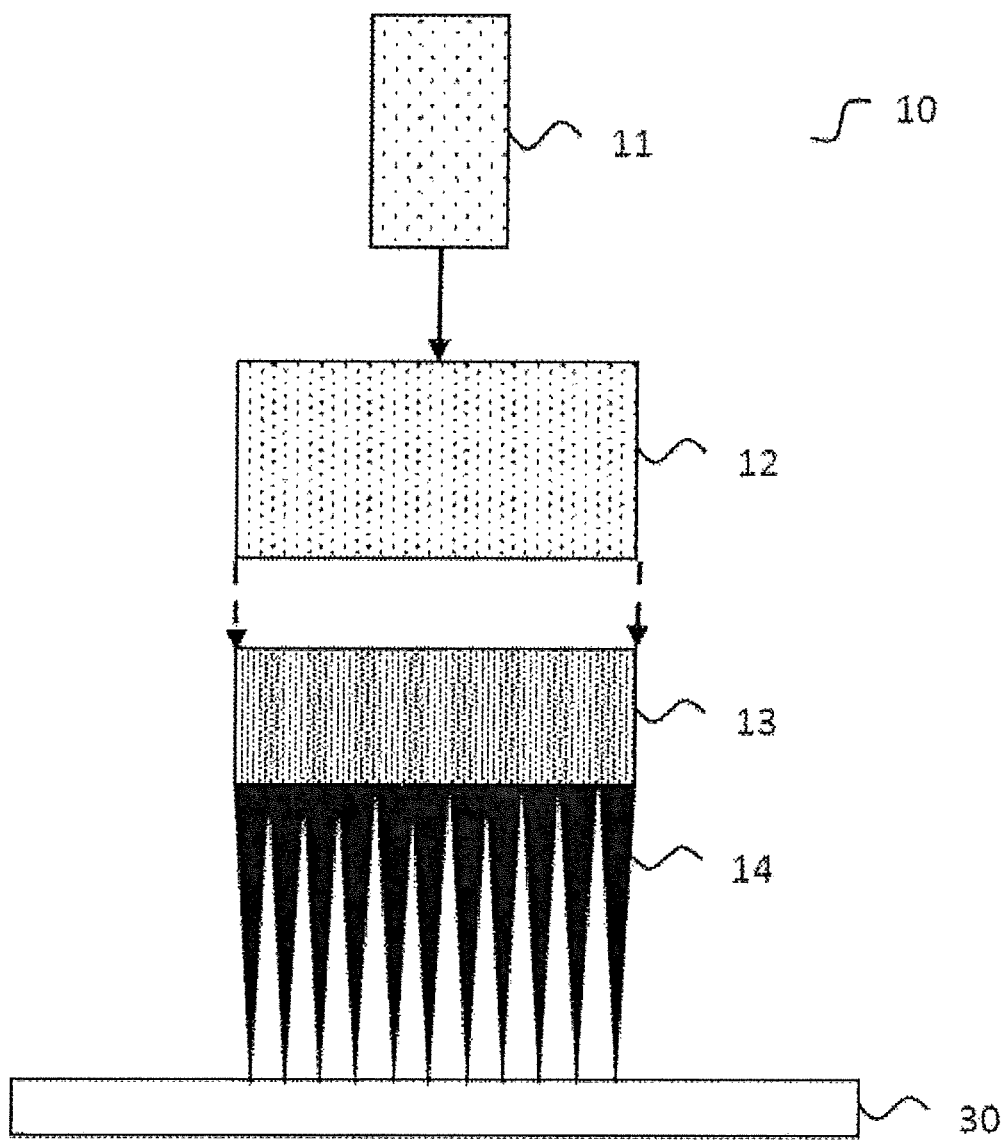
FIG. 1 is a diagram illustrating a configuration example of a laser irradiation device 10.

10 Laser irradiation device
11 Laser beam source
12 Coupling optical system
13 Microlens array
14 Laser beam
15 Projection mask pattern
16 Transmission region
17 Microlens
18 Projection lens
20 Thin-film transistor
21 Amorphous silicon thin film
22 Polysilicon thin film
23 Source
24 Drain
30 Glass substrate

DETAILED DESCRIPTION

Hereinafter, examples will be described specifically with reference to the accompanying drawings.

First Example

FIG. 1 is a diagram illustrating a configuration example of a laser irradiation device 10. The laser irradiation device 10 is, for example, a device that performs annealing by irradiating only a region in which a channel region is scheduled to be formed with a laser beam to anneal this region to thereby form the region in which a channel region is scheduled to be formed into a polycrystal in a manufacturing process for a semiconductor such as the thin-film transistor (TFT) 20.

The laser irradiation device 10 is used, for example, when a thin-film transistor of a pixel such as in a peripheral circuit of a liquid crystal display device is formed. When such a thin-film transistor is formed using a pattern through sputtering, first, a gate electrode constituted by a film of a metal such as Al is formed on a glass substrate 30. In addition, a gate insulating film constituted of an SiN film is formed on the entire surface of the glass substrate 30 by a low-temperature plasma CVD method. Thereafter, an amorphous silicon thin film 21 is formed on the gate insulating film by, for example, a plasma CVD method. In addition, annealing is performed by irradiating a predetermined region on a gate electrode of the amorphous silicon thin film 21 with a laser beam 14 with the laser irradiation device 10 illustrated in FIG. 1 to form the predetermined region into a polycrystalline film, thereby forming the predetermined region as polysilicon.

As illustrated in FIG. 1, in the laser irradiation device 10, a beam system of a laser beam emitted from a laser beam source 11 is expanded by a coupling optical system 12, and a luminance distribution becomes uniform. The laser beam source 11 is an excimer laser that radiates, for example, a laser beam having a wavelength of 308 nm, 248 nm or the like at predetermined repeated time intervals.

Thereafter, a laser beam is divided into a plurality of laser beams 14 by a plurality of openings (transmission region) of a projection mask pattern 15 (not shown) provided on a microlens array 13 and is emitted onto a predetermined region of the amorphous silicon thin film 21. The microlens array 13 is provided with the projection mask pattern 15, and a predetermined region is irradiated with the laser beam 14 by the projection mask pattern 15. In addition, the predetermined region of the amorphous silicon thin film 21 is instantaneously heated and melted so that a portion of the amorphous silicon thin film 21 becomes a polysilicon thin film 22.

The polysilicon thin film 22 has an electron mobility higher than that of the amorphous silicon thin film 21 and is used for a channel region that electrically connects the source 23 and the drain 24 in the thin-film transistor 20. Although FIG. 1 shows an example in which the microlens array 13 is used, the microlens array 13 is not necessarily used, and the laser beam 14 may be emitted using one projection lens. When the polysilicon thin film 22 is formed using the microlens array 13 is one example.

Figure 2:
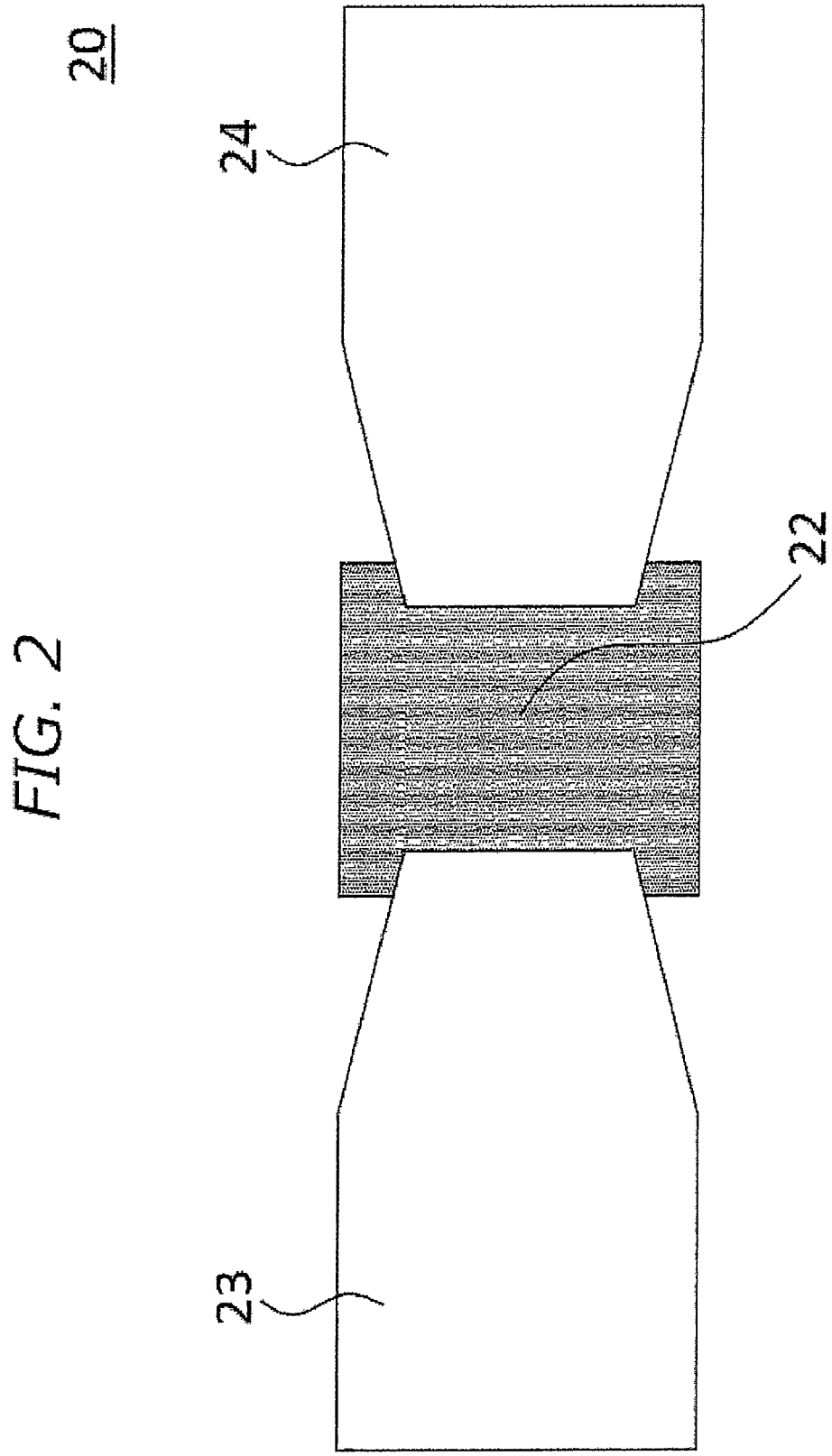
FIG. 2 is a schematic view illustrating an example of a thin-film transistor 20 in which a predetermined region is annealed.

FIG. 2 is a schematic view illustrating an example of the thin-film transistor 20 in which a predetermined region is annealed. The thin-film transistor 20 is created by first forming the polysilicon thin film 22 and then forming the source 23 and the drain 24 at both ends of the formed polysilicon thin film 22.

As illustrated in FIG. 2, in the thin-film transistor, the polysilicon thin film 22 is formed between the source 23 and the drain 24. The laser irradiation device 10 irradiates the thin-film transistor 20 with the laser beam 14 using, for example, 20 microlenses 17 included in one column (or one row) of the microlens array 13. That is, the laser irradiation device 10 irradiates the polysilicon thin film 22 with 20 shots of the laser beam 14. As a result, in the thin-film transistor 20, a predetermined region of the amorphous silicon thin film 21 is instantaneously heated and melted, thereby forming the polysilicon thin film 22.

There is a possibility that electron mobility of the polysilicon thin film 22 may be varying due to an energy density of the laser beam 14 varying for each shot because the electron mobility of the polysilicon thin film 22 depends on the energy density of the laser beam 14 finally emitted onto the polysilicon thin film 22, that is, the energy density of the last shot, as described above.

The laser irradiation device 10 irradiates the amorphous silicon thin film 21 with the laser beam 14. The laser irradiation device 10 emits the laser beam 14 at predetermined cycles, moves the glass substrate 30 at a time when the laser beam 14 is not emitted, and emits the laser beam 14 onto a location of the next amorphous silicon thin film 21.

Figure 3:
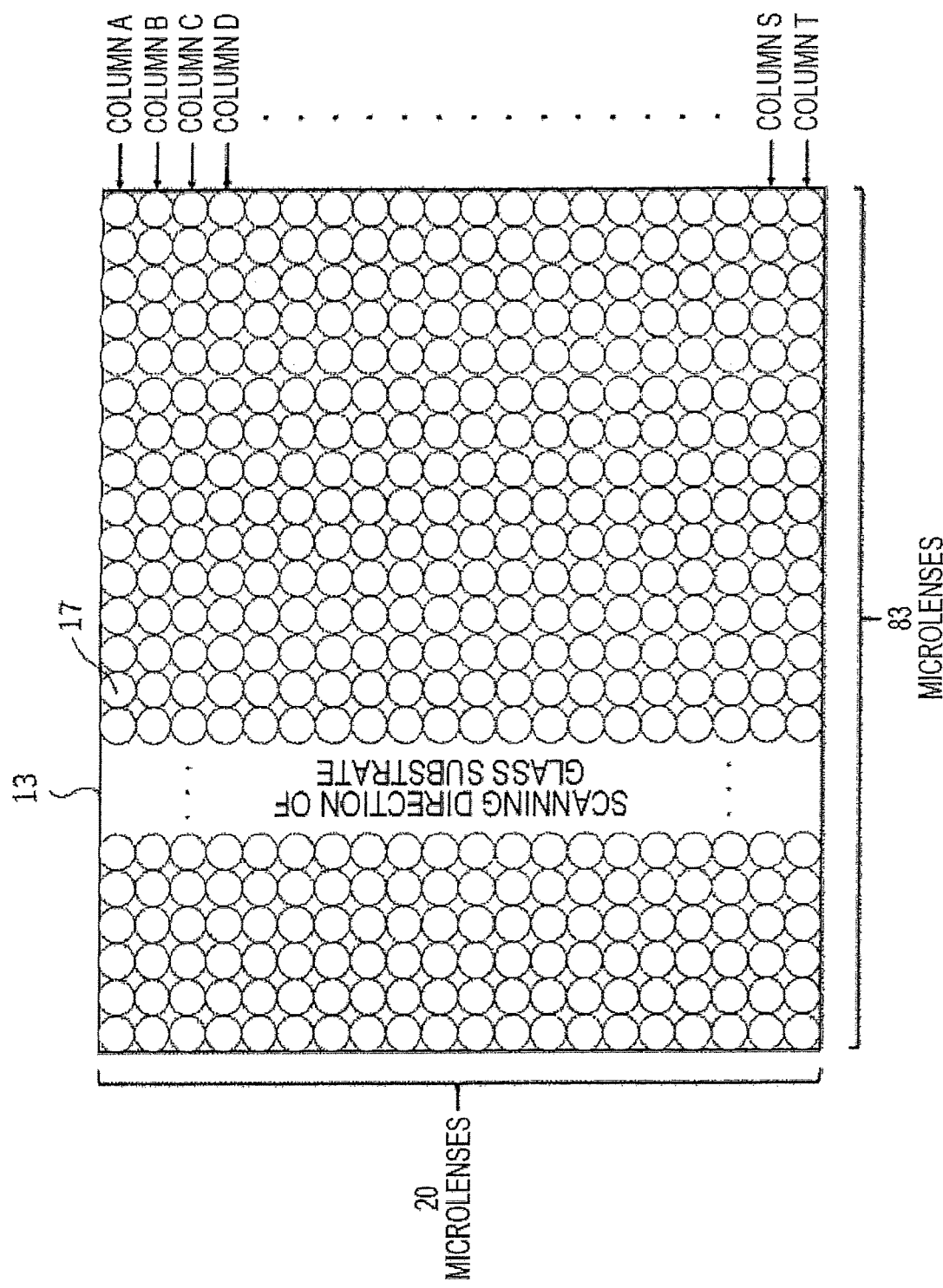
FIG. 3 is a diagram illustrating a configuration example of a microlens array 13.

FIG. 3 is a diagram illustrating a configuration example of the microlens array 13 when the microlenses 17 are arranged in vertical and horizontal directions. As illustrated in FIG. 3, in the microlens array 13, 20 microlenses 17 are in one column (or one row) in a scanning direction. The laser irradiation device 10 irradiates one thin-film transistor 20 with the laser beam 14 using at least some of the 20 microlenses 17 included in one column (or one row) of the microlens array 13. Meanwhile, the number of microlenses 17 of one column (or one row) included in the microlens array 13 is not limited to 20 and may be any number. In addition, as illustrated in FIG. 3, the microlens array 13 includes 20 microlenses 17 in one column (or one row), but includes, for example, 83 microlenses 17 in one row (or one column). Meanwhile, the number of 83 is merely an example, and the number of microlenses 17 may be any number.

When the laser irradiation device 10 forms the polysilicon thin film 22 using the microlens array 13 illustrated in FIG. 3, there is a concern that display unevenness may occur in a liquid crystal screen which is a finished product. Hereinafter, the description thereof will be given.

Figure 4:
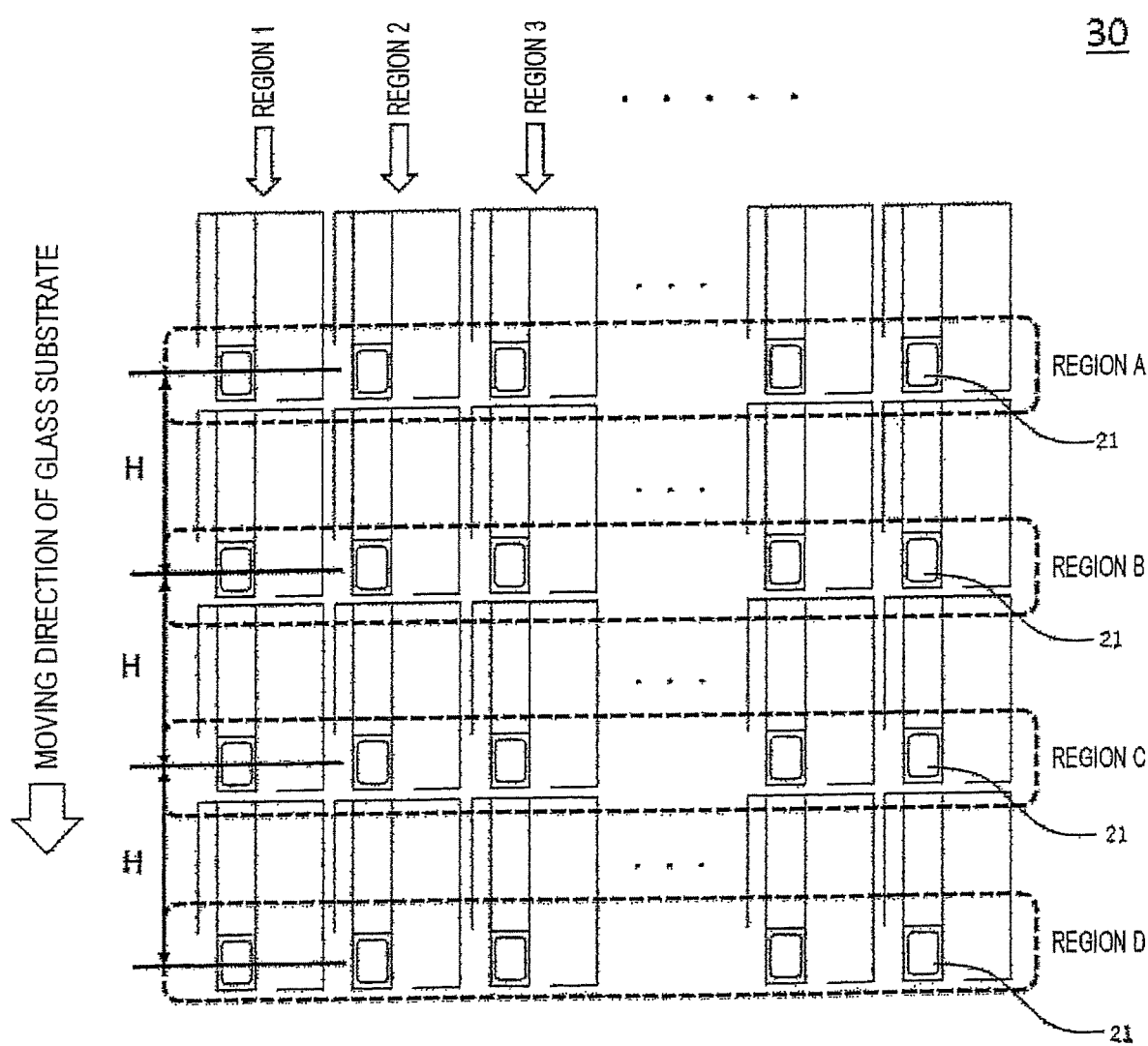
FIG. 4 is a schematic view illustrating an example of a glass substrate 30 irradiated with a laser beam 14 by the laser irradiation device 10.

FIG. 4 is a diagram illustrating a configuration example of the glass substrate 30. The amorphous silicon thin films 21 are on the glass substrate 30 in a moving direction at predetermined intervals "H." In addition, the laser irradiation device 10 irradiates the portions of the amorphous silicon thin films 21 on the glass substrate 30 with the laser beam 14 at predetermined cycles.

In addition, the laser irradiation device 10 irradiates the plurality of amorphous silicon thin films 21 on the glass substrate with the same laser beam 14 using the microlens array 13 illustrated in FIG. 3. For example, the laser irradiation device 10 irradiates a plurality of amorphous silicon thin films 21 included in a region A illustrated in FIG. 4 with the same laser beam 14. In addition, the laser irradiation device 10 irradiates a plurality of amorphous silicon thin films 21 included in a region B illustrated in FIG. 4 with the same laser beam 14.

It is possible for the laser irradiation device 10 to emit the laser beam 14 using each of the 20 microlenses 17 included in one column (or one row) of the microlens array 13 illustrated in FIG. 3 to perform annealing.

In this example, the plurality of amorphous silicon thin films 21 positioned in the region A of FIG. 4 are first irradiated with the laser beam 14 using a first microlens 17 included in a column A of the microlens array 13 illustrated in FIG. 3. Thereafter, the glass substrate 30 is moved by the predetermined interval "H." While the glass substrate 30 is moved, the laser irradiation device 10 stops emitting the laser beam 14. In addition, after the glass substrate 30 is moved by "H," the plurality of amorphous silicon thin films 21 positioned in the region A are irradiated with the laser beam 14 using a second microlens 17 included in a column B of the microlens array 13 illustrated in FIG. 3.

The laser irradiation device 10 repeatedly performs this processing and finally irradiates the plurality of amorphous silicon thin films 21 positioned in the region A with the laser beam 14 using microlenses 17 included in a column T of the microlens array 13 illustrated in FIG. 3. As a result, the plurality of amorphous silicon thin films 21 positioned in the region A are irradiated with the laser beam 14 using each of the 20 microlenses 17 included in one column (or one row) of the microlens array 13 illustrated in FIG. 3.

Similarly, the laser irradiation device 10 also irradiates the plurality of amorphous silicon thin films 21 positioned in the region B of FIG. 4 with the laser beam 14 using each of the 20 microlenses 17 included in one column (or one row) of the microlens array 13 illustrated in FIG. 3. However, since the position of the region B is different from that of the region A by "H" in the moving direction of the glass substrate, a timing when the laser beam 14 is emitted is delayed by one irradiation. That is, when the plurality of amorphous silicon thin films 21 of the region A are irradiated with the laser beam 14 using the second microlens 17 of the column B, the plurality of amorphous silicon thin films 21 of the region B are irradiated with the laser beam 14 using the first microlens 17 of the column A. In addition, when the plurality of amorphous silicon thin films 21 of the region A are irradiated with the laser beam 14 using a 20th microlens 17 of the column T, the plurality of amorphous silicon thin films 21 of the region B are irradiated with a laser beam using a 19th microlens 17 of a column S. In addition, the plurality of amorphous silicon thin films 21 of the region B are irradiated with a laser beam using the 20th microlens 17 of the column T at a timing of irradiation with the next laser beam.

The plurality of amorphous silicon thin films 21 included in the region A illustrated in FIG. 4 and the plurality of amorphous silicon thin films 21 included in the region B differ in the laser beam 14 to be emitted finally.

In an excimer laser, the stability between pulses is approximately 0.5%. That is, the laser irradiation device 10 causes a variation of approximately 0.5% in the energy density of the laser beam 14 for each shot. For this reason, there is a possibility that a variation may occur in the electron mobility of the polysilicon thin film 22 formed by the laser irradiation device 10. In addition, the electron mobility of the polysilicon thin film 22 formed by irradiation with the laser beam 14 depends on the energy density of the laser beam 14 finally emitted onto the polysilicon thin film 22, that is, the energy density of the last shot.

For this reason, since the plurality of amorphous silicon thin films 21 included in the region A and the plurality of amorphous silicon thin films 21 included in the region B differ in a laser beam to be finally emitted, the electron mobilities of the polysilicon thin films 22 to be formed are different from each other.

On the other hand, since the plurality of amorphous silicon thin films 21 included in the region A have the finally emitted laser beam 14 in common with each other, the electron mobilities of the polysilicon thin films 22 to be formed are the same within the region A. This is the same for the plurality of amorphous silicon thin films 21 included in the region B, and the electron mobilities of the polysilicon thin films 22 to be formed are the same within the region B. That is, although electron mobilities are different from each other between regions adjacent to each other on the glass substrate, electron mobilities are the same as each other in the plurality of amorphous silicon thin films 21 within the same region.

This results in the occurrence of display unevenness on the liquid crystal screen. As illustrated in FIG. 4, since a boundary between the region A and the region B has a "linear shape," the thin-film transistors 20 having different characteristics abut against each other at the "linear" boundary, and a difference in display (for example, a difference in the shading of colors, or the like) due to the difference between the characteristics is shown as a "line." As a result, display unevenness becomes "stripes" on the liquid crystal screen and is emphasized to an extent that is not negligible.

Figure 5:
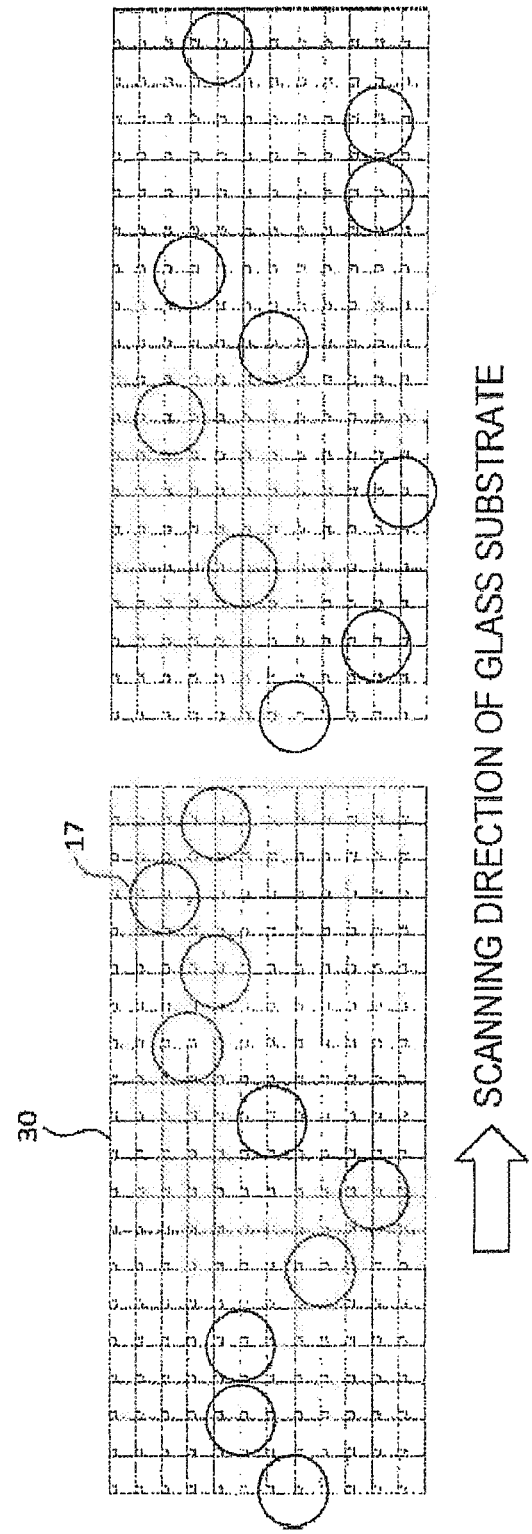
FIG. 5 is a diagram illustrating a configuration example of the microlens array 13.

Consequently, in the first example, as illustrated in FIG. 5, the laser beam 14 is emitted using the microlens array 13 having a plurality of columns, each including a predetermined number of microlenses 17 and provided parallel to the moving direction of the glass substrate 30, and configured such that at least some of the predetermined number of microlenses are not on a straight line parallel to the moving direction in each of the plurality of columns.

FIG. 5 illustrates one column among a plurality of columns provided parallel to the moving direction of the glass substrate 30 in the microlens array 13 in the first example. As illustrated in FIG. 5, in one column of the parallel microlenses 17 included in the microlens array 13, at least some of the plurality of microlens 17 are not on a straight line parallel to the moving direction of the glass substrate 30.

In the microlens array 13 illustrated in FIG. 5, at least some of the plurality of microlens 17 are not on a straight line parallel to the moving direction of the glass substrate 30. Since some of the plurality of microlenses are not on a straight line, at least some amorphous silicon thin films 21 adjacent to each other on the glass substrate 30 are irradiated with different laser beams 14. As a result, electron mobilities of the adjacent polysilicon thin films 22 are different from each other. That is, the thin-film transistors 20 adjacent to each other have different characteristics in the entire glass substrate 30, and thus a difference in display (for example, a difference in the shading of colors, or the like) due to the difference between the characteristics is not shown "linearly." For this reason, display unevenness does not become "stripes" on the liquid crystal screen, and thus it is possible to prevent the display unevenness from being emphasized.

Figure 6:
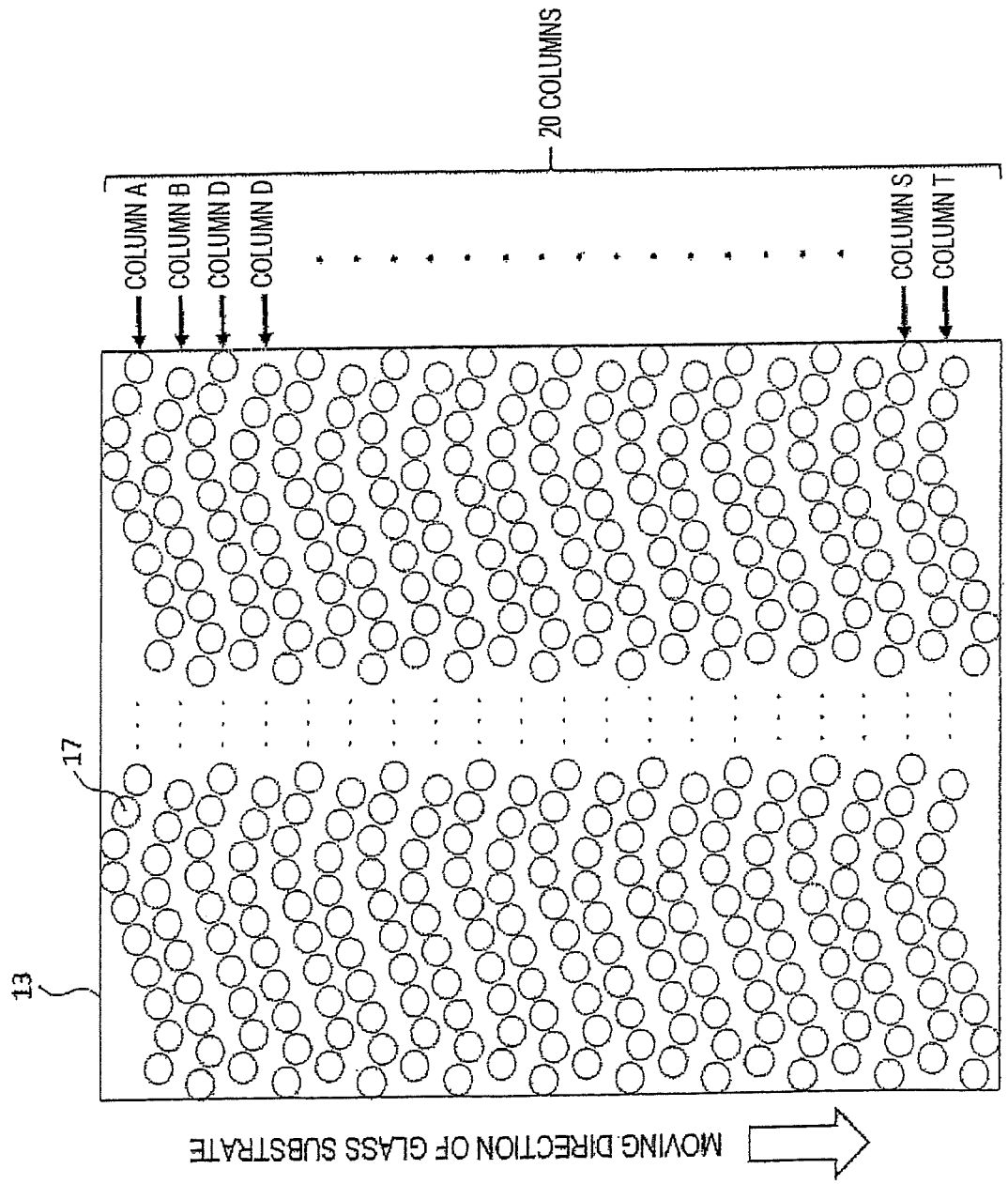
FIG. 6 is a diagram illustrating another configuration example of the microlens array 13.

As the microlens array 13 in which at least some of the plurality of microlens 17 are not on a straight line parallel to the moving direction of the glass substrate 30, for example, a microlens array 13 in which one column of the microlenses 17 is on a substantially sine curve (sine wave) is possible. FIG. 6 illustrates a configuration example of the microlens array 13 in which one column of the microlenses 17 is on a substantially sine curve (sine wave). Meanwhile, the microlenses 17 may be on a sine curve or may be "substantially on a sine curve." Although it cannot be strictly said that "substantially a sine curve" is a sine curve, "substantially a sine curve" means a waveform having a shape close to a sine curve.

Meanwhile, the microlens array 13 illustrated in FIG. 6 is merely an example, and the arrangement of the microlenses 17 is not limited to this example. For example, the microlenses 17 may be on a cosine curve (cosine wave) or "substantially a cosine curve." In addition, each of the microlenses 17 is not necessarily on a sine curve or a cosine curve, and may be on a waveform having a predetermined period.

In addition, as illustrated in FIG. 6, columns of the microlenses 17 adjacent to each other in the microlens array 13 are disposed to be shifted from each other by a predetermined distance. Specifically, the microlenses 17 of the column A and the microlenses 17 of the column B are disposed to be shifted from each other by a predetermined distance. The predetermined distance is an interval "H" between groups of the amorphous silicon thin films 21 on the glass substrate 30. That is, the columns of the microlenses 17 adjacent to each other in the microlens array 13 correspond to the amorphous silicon thin films 21 adjacent to each other on the glass substrate 30. Meanwhile, the predetermined distance may be a natural number multiple of the interval "H." In this example, respective columns of the microlenses 17 adjacent to each other in the microlens array 13 correspond to each of the amorphous silicon thin films 21 several amorphous silicon thin films 21 (a number of a natural number multiple) ahead on the glass substrate 30.

Figure 7:
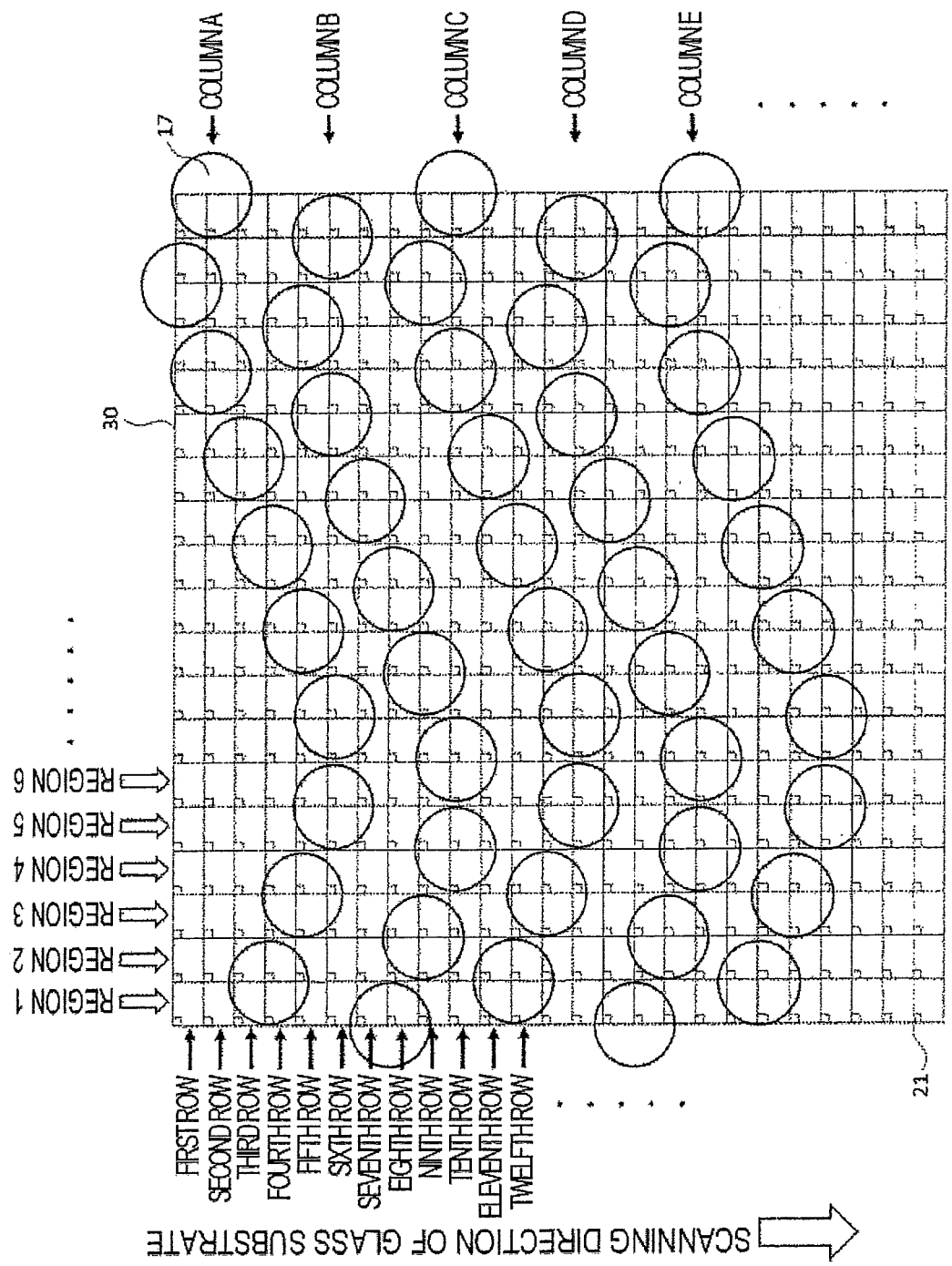
FIG. 7 is a diagram illustrating laser annealing performed by the microlens array 13.

FIG. 7 is a diagram illustrating an association relationship between the microlenses 17 included in the microlens array 13 and the amorphous silicon thin films 21 included in the glass substrate 30. Meanwhile, FIG. 7 illustrates an example of when the columns of the microlenses 17 adjacent to each other in the microlens array 13 correspond to the amorphous silicon thin films 21 adjacent to each other on the glass substrate 30.

As illustrated in FIG. 7, the microlenses 17 of the column A correspond to the amorphous silicon thin films 21 in "a region 2, a region 4, a region 6, . . . " of the glass substrate 30. On the other hand, the microlenses 17 of the column B correspond to the amorphous silicon thin films 21 in "a region 3, a region 5, a region 7, . . . " of the glass substrate 30. In this manner, the columns of the microlenses 17 adjacent to each other in the microlens array 13 correspond to the amorphous silicon thin films 21 in different regions. Meanwhile, the arrangement of the microlenses 17 in the microlens array 13 of FIG. 7 is merely an example, and the arrangement of the microlenses 17 may be made in any way as long as the microlenses 17 correspond to the amorphous silicon thin films 21 in different regions.

As illustrated in FIG. 7, the microlenses 17 of the column A corresponds to the amorphous silicon thin films 21 of "a fourth row in the region 2, a fifth row in the region 4, a sixth row in the region 6, . . . ". In addition, each of the microlenses 17 of the column B corresponds to the amorphous silicon thin films 21 of "an eighth row in the region 1, a ninth row in the region 3, a tenth row in the region 5, . . . ". In this manner, the microlenses 17 included in the same column (for example, the column A or the column B) correspond to the amorphous silicon thin films 21 which are not adjacent to each other on the glass substrate 30. Meanwhile, the arrangement of the microlenses 17 in the microlens array 13 of FIG. 7 is merely example, and the arrangement of the microlenses 17 may be made in any way as long as the microlenses 17 included in the same column correspond to the amorphous silicon thin films 21 which are not adjacent to each other.

As described above, when the laser beam 14 is emitted using the microlens array 13 illustrated in FIG. 7, the amorphous silicon thin films 21 which are adjacent to each other on the glass substrate 30 are irradiated with the laser beam 14 by the microlenses 17 included in different columns. In addition, timings when the amorphous silicon thin films 21 adjacent to each other on the glass substrate 30 are finally irradiated with the laser beam 14 are different from each other.

For example, a description will be given by taking the amorphous silicon thin film 21 of the eighth row in the region 1 of FIG. 7 and the amorphous silicon thin film 21 of an eighth row in the region 2 as examples. First, the amorphous silicon thin film 21 of the eighth row in the region 1 is irradiated with the laser beam 14 using the microlenses 17 of the column B included in the microlens array 13. On the other hand, the amorphous silicon thin film 21 of the eighth row in the region 2 is irradiated with the laser beam 14 using the microlenses 17 of the column A included in the microlens array 13. In this manner, the amorphous silicon thin films 21 adjacent to each other are irradiated with the laser beam 14 by the microlenses 17 included in different columns.

In addition, since the amorphous silicon thin film 21 of the eighth row in the region 1 is finally irradiated with the laser beam 14, the amorphous silicon thin film 21 of the eighth row in the region 2 is finally irradiated with the laser beam 14 after four shots. This is because the microlenses 17 included in different columns are separated by three or four shots in the microlens array 13 illustrated in FIG. 7.

In this manner, the amorphous silicon thin films 21 adjacent to each other are finally irradiated with the laser beam 14 at different timings by the microlenses 17 included in different columns on the glass substrate 30.

In the excimer laser, the stability between pulses is approximately 0.5%. That is, the laser irradiation device 10 causes a variation of approximately 0.5% in the energy density of the laser beam 14 for each shot. For this reason, there is a possibility that a variation may occur in the electron mobility of the polysilicon thin film 22 formed by the laser irradiation device 10. In addition, the electron mobility of the polysilicon thin film 22 formed by irradiation with the laser beam 14 depends on the energy density of the laser beam 14 finally emitted onto the polysilicon thin film 22, that is, the energy density of the last shot.

As described above, when the microlens array 13 illustrated in FIG. 7 is used, the amorphous silicon thin films 21 adjacent to each other on the glass substrate 30 are irradiated with the laser beam 14 using the microlenses 17 included in different columns. For this reason, the laser beam 14 to be finally emitted varies, which results in a difference in electron mobility between the polysilicon thin films 22 to be formed.

Therefore, in the entire glass substrate 30, the thin-film transistors 20 adjacent to each other have different characteristics. For this reason, differences in display (for example, differences in the shading of colors or the like) due to differences between the characteristics of the thin-film transistors 20 are dispersed and are not shown linearly. For this reason, display unevenness does not become "stripes" on the liquid crystal screen, and thus it is possible to prevent the display unevenness from being emphasized.

In the first example, the glass substrate 30 is moved by a predetermined distance whenever the laser beam 14 is emitted using one microlens 17. The predetermined distance is the distance "H" between the plurality of thin-film transistors 20 on the glass substrate 30 as illustrated in FIG. 3. The laser irradiation device 10 stops emitting the laser beam 14 while the glass substrate 30 is moved by the predetermined distance.

After the glass substrate 30 is moved by the predetermined distance "H," the laser irradiation device 10 emits the laser beam 14 using the microlens 17 included in the microlens array 13. In the first example, the microlens array 13 illustrated in FIG. 7 is used, and thus one amorphous silicon thin film 21 is irradiated with the laser beam 14 using 10 microlenses 17 during one scanning. For example, in FIG. 7, the amorphous silicon thin film 21 of a first column in the region 1 is irradiated with the laser beam 14 using the microlenses 17 included in a total of 10 columns of a column B, a column D, a column F, . . . . For this reason, it is necessary to perform scanning twice using the microlens array 13 illustrated in FIG. 7 to irradiate one amorphous silicon thin film 21 with the laser beam 14 twenty times.

Consequently, in the first example, scanning is performed once using the microlens array 13 illustrated in FIG. 7 in a direction perpendicular to the moving direction of the glass substrate 30, and then second scanning is performed by returning the glass substrate 30 (or the microlens array 13) to a starting position of the scanning.

Thereafter, the polysilicon thin film 22 is formed in the thin-film transistor 20 of the glass substrate 30 using laser annealing, and then the source 23 and the drain 24 are formed in the thin-film transistor 20 in another step.

The laser irradiation device 10 may irradiate the glass substrate 30, which is moved by "H" and then stopped temporarily, with the laser beam 14 or may irradiate the continuously moving glass substrate 30 with the laser beam 14.

An irradiation head (that is, the laser beam source 11, the coupling optical system 12, the microlens array 13 and the projection mask 150) of the laser irradiation device 10 may be moved to the glass substrate 30.

In this manner, in the first example, the amorphous silicon thin film 21 is irradiated with the laser beam 14 using, for example, the microlens array 13 in which one column of the microlenses 17 is on a substantially sine curve. As a result, the amorphous silicon thin films 21 adjacent to each other are irradiated with different laser beams 14. For this reason, electron mobilities of the polysilicon thin films 22 adjacent to each other are different from each other. That is, in the entire glass substrate 30, characteristics of the thin-film transistors 20 adjacent to each other are different from each other, and thus a difference in display (for example, a difference in the shading of colors or the like) due to the difference between the characteristics is not shown "linearly." For this reason, display unevenness does not become "stripes" on the liquid crystal screen, and thus it is possible to prevent the display unevenness from being emphasized.

Second Example

A second example is our example where a microlens array 13 is moved in a direction orthogonal to a scanning direction by a predetermined phase of a substantially sine curve on which one column of microlenses 17 is disposed after first scanning is terminated, and then second scanning is performed.

Figure 8:
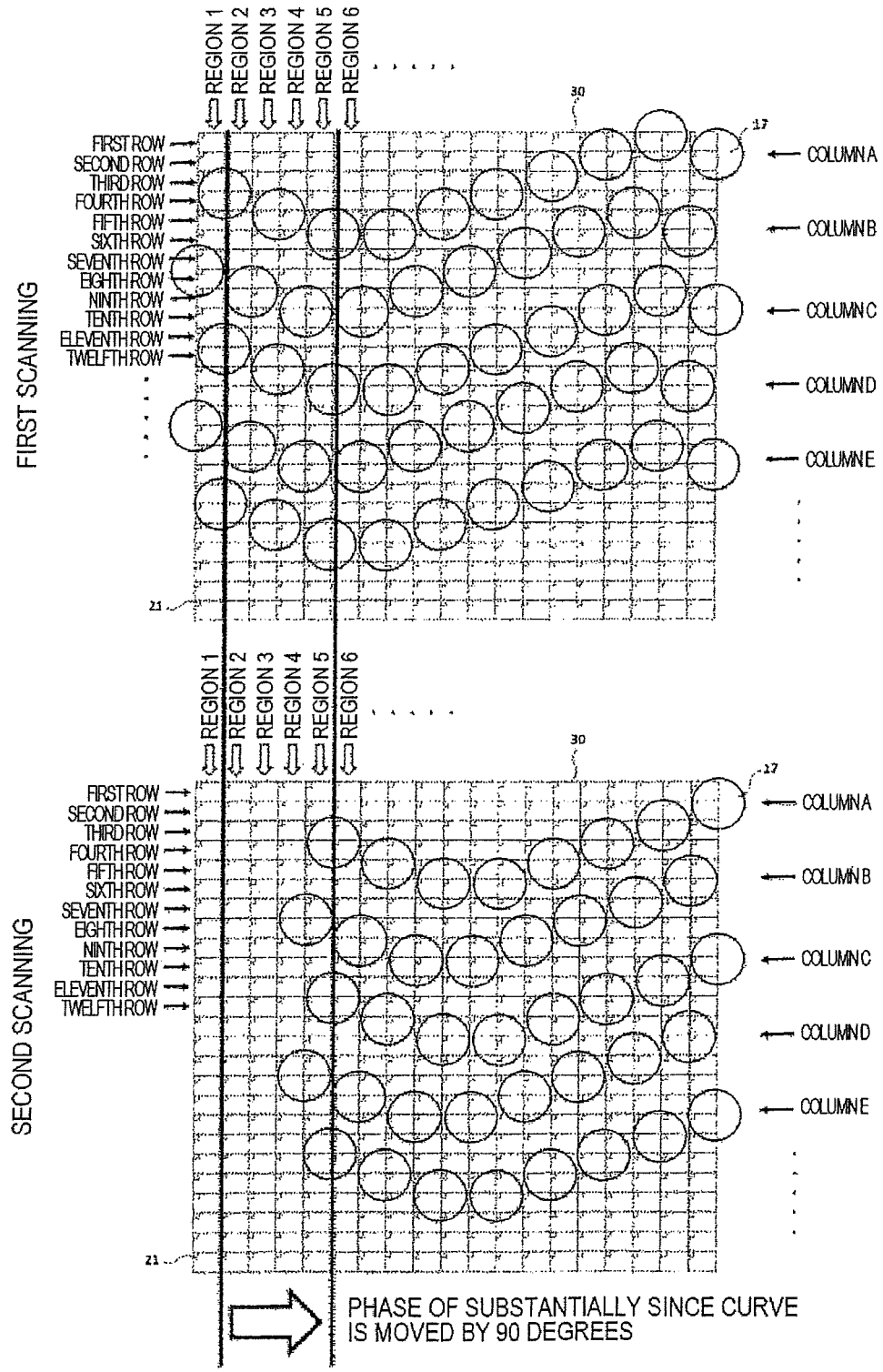
FIG. 8 is another diagram illustrating laser annealing performed by the microlens array 13.

FIG. 8 is a diagram illustrating an association relationship between the microlenses 17 included in the microlens array 13 and amorphous silicon thin films 21 included in a glass substrate 30 in the second example.

The number of microlenses 17 that can be included in one row (or one column) in a direction perpendicular to a scanning direction of the microlens array depends on an output of a laser beam 14 using a laser irradiation device 10. For this reason, the laser irradiation device 10 needs to repeatedly perform a process of performing scanning in the scanning direction, moving by one step (by a long side of the microlens array) in a direction perpendicular to the scanning direction, and performing scanning again in the scanning direction to perform laser annealing processing on the entire glass substrate. For this reason, a "linear" junction (junction region) may be present between a region annealed through one scanning and a region annealed through the next scanning. In this manner, when the laser beam 14 is emitted in a state where the "linear" junction (junction region) appears, the "linear" junction (junction region) may be recognized as "junction unevenness" on a liquid crystal screen.

Consequently, in the second example, the occurrence of "junction unevenness" is reduced by performing annealing so that a "linear" junction (junction region) is not formed between a region annealed through one scanning and a region annealed through the next scanning.

For this reason, in the second example, scanning is performed once using the microlens array 13 illustrated in FIG. 7, and then second scanning is performed by shifting the microlens array 13 in a moving direction of the glass substrate 30 by a predetermined phase of a substantially sine curve on which the microlenses 17 are disposed.

Also, in the second example, since the microlens array 13 illustrated in FIG. 7 is used, one amorphous silicon thin film 21 is irradiated with the laser beam 14 using 10 microlenses 17 during one scanning. For example, in FIG. 7, the amorphous silicon thin film 21 of a first column in a region 1 is irradiated with the laser beam 14 using microlenses 17 included in a total of 10 columns of a column B, a column D, a column F, . . . . For this reason, it is necessary to perform scanning twice using the microlens array 13 illustrated in FIG. 7 to irradiate one amorphous silicon thin film 21 with the laser beam 14 twenty times.

In this example, scanning is performed once using the microlens array 13 illustrated in FIG. 7, and then second scanning is performed by shifting the phase of a substantially sine curve on which the microlenses 17 are in a moving direction of the glass substrate 30 by 90 degrees. Meanwhile, a predetermined phase may be, for example, 90 degrees as illustrated in FIG. 8 or may be 180 degrees, 270 degrees or the like.

As illustrated in FIG. 8, when the second scanning is performed, the microlens array 13 is shifted in a moving direction of the glass substrate 30 by a predetermined phase so that a region annealed through one scanning and a region annealed through the next scanning are superimposed on each other by the predetermined phase. Since there are regions superimposed on each other, a "linear" junction (junction region) appears at a boundary between the region annealed through one scanning and the region annealed through the next scanning.

Step of Annealing Process

In the example, the laser irradiation device 10 irradiates the glass substrate 30 with the laser beam 14 using the microlens array 13 provided with a projection mask pattern illustrated in FIG. 6.

The glass substrate 30 is moved (scanned) by a predetermined distance whenever the laser beam 14 is emitted using the microlens array 13. The predetermined distance is an interval "H" between the plurality of thin-film transistors 20 on the glass substrate 30 as illustrated in FIG. 3. The laser irradiation device 10 stops emitting the laser beam 14 while the glass substrate 30 is moved by the predetermined distance.

After the glass substrate 30 is moved by the predetermined distance (that is, the interval "H" between the plurality of thin-film transistors 20), the laser irradiation device 10 emits the laser beam 14 using the microlens array 13. The laser irradiation device 10 performs an annealing process in the vertical direction of the glass substrate 30 (a scanning direction, that is, a direction in which the glass substrate 30 is moved by the predetermined distance) by repeatedly performing irradiation with the laser beam 14 using the microlens array 13 and movement of the glass substrate 30.

Thereafter, the glass substrate 30 is moved in a direction perpendicular to the scanning direction by a predetermined phase of a substantially sine curve on which one column of the microlenses 17 is disposed. The laser irradiation device 10 stops emitting the laser beam 14 while the glass substrate 30 is moved by one step. Thereafter, the laser irradiation device 10 emits the laser beam 14 using the microlens array 13 to perform second scanning.

Thereafter, the glass substrate 30 is moved by one step (by a distance corresponding to the width of the microlens array 13) in a direction perpendicular to the scanning direction. After the glass substrate 30 is moved by one step, the laser irradiation device 10 emits the laser beam 14 using the microlens array 13 to perform annealing in the vertical direction of the glass substrate 30.

In addition, the polysilicon thin film 22 is formed in the entire thin-film transistor 20 included in the glass substrate 30 using laser annealing, and then the source 23 and the drain 24 are formed in the thin-film transistor 20 in another step.

In this manner, in the second example, there is no junction between annealing processes performed through different scanning operations. Since there is no junction, "junction unevenness" does not also occur, and thus it is possible to provide a high-quality liquid crystal screen and the like by performing an annealing process by the laser irradiation device 10 in the first example.

Third Example

A third example is where laser annealing is performed using one projection lens 18 instead of the microlens array 13.

Figure 9:
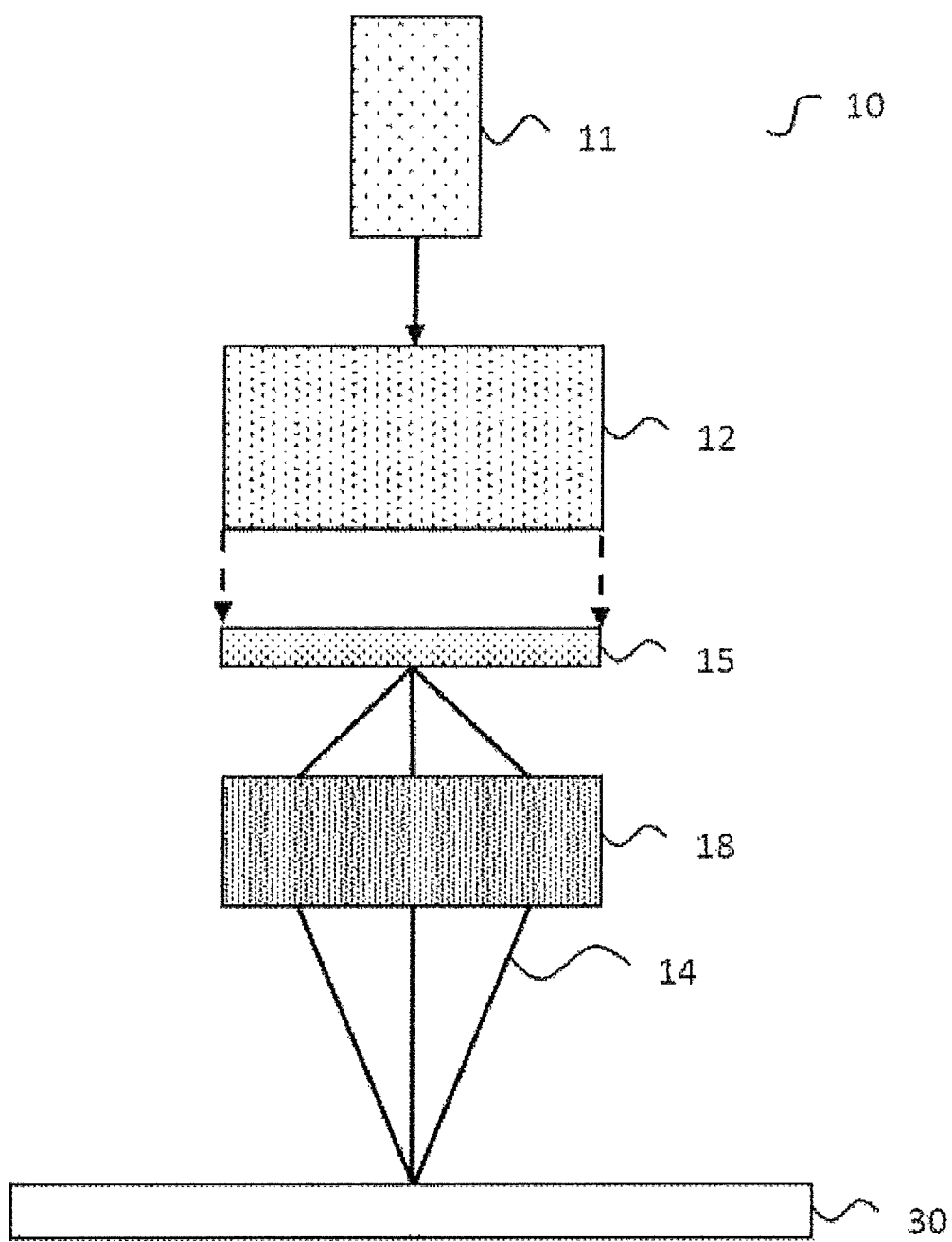
FIG. 9 is a diagram illustrating another configuration example of the laser irradiation device 10.

FIG. 9 is a diagram illustrating a configuration example of a laser irradiation device 10 in the third example. As illustrated in FIG. 9, the laser irradiation device 10 in the third example includes a laser beam source 11, a coupling optical system 12, a projection mask pattern 15 and a projection lens 18. Meanwhile, the laser beam source 11 and the coupling optical system 12 are the same components as the laser beam source 11 and the coupling optical system 12 in the first example illustrated in FIG. 1, and thus detailed description thereof will be omitted.

In the third example, a laser beam 14 is emitted using a projection mask pattern 15 having a plurality of columns, each including a predetermined number of opening portions 16 and provided parallel to the moving direction of the glass substrate 30, and configured such that at least some of the predetermined number of opening portions 16 are not on a straight line parallel to the moving direction in each of the plurality of columns.

In one column of the opening portions 16 included in the projection mask pattern 15, at least some of the plurality of opening portions 16 are not on a straight line parallel to the moving direction of the glass substrate 30. Since at least some of the opening portions 16 are not on the parallel straight line, at least some amorphous silicon thin films 21 adjacent to each other on the glass substrate 30 are irradiated with different laser beams 14. As a result, electron mobilities of polysilicon thin films 22 adjacent to each other are different from each other. That is, the thin-film transistors 20 adjacent to each other have different characteristics in the entire glass substrate 30, and thus a difference in display (for example, a difference in the shading of colors or the like) due to the difference between the characteristics is not shown "linearly." For this reason, display unevenness does not become "stripes" on the liquid crystal screen, and thus it is possible to prevent the display unevenness from being emphasized.

Figure 10:
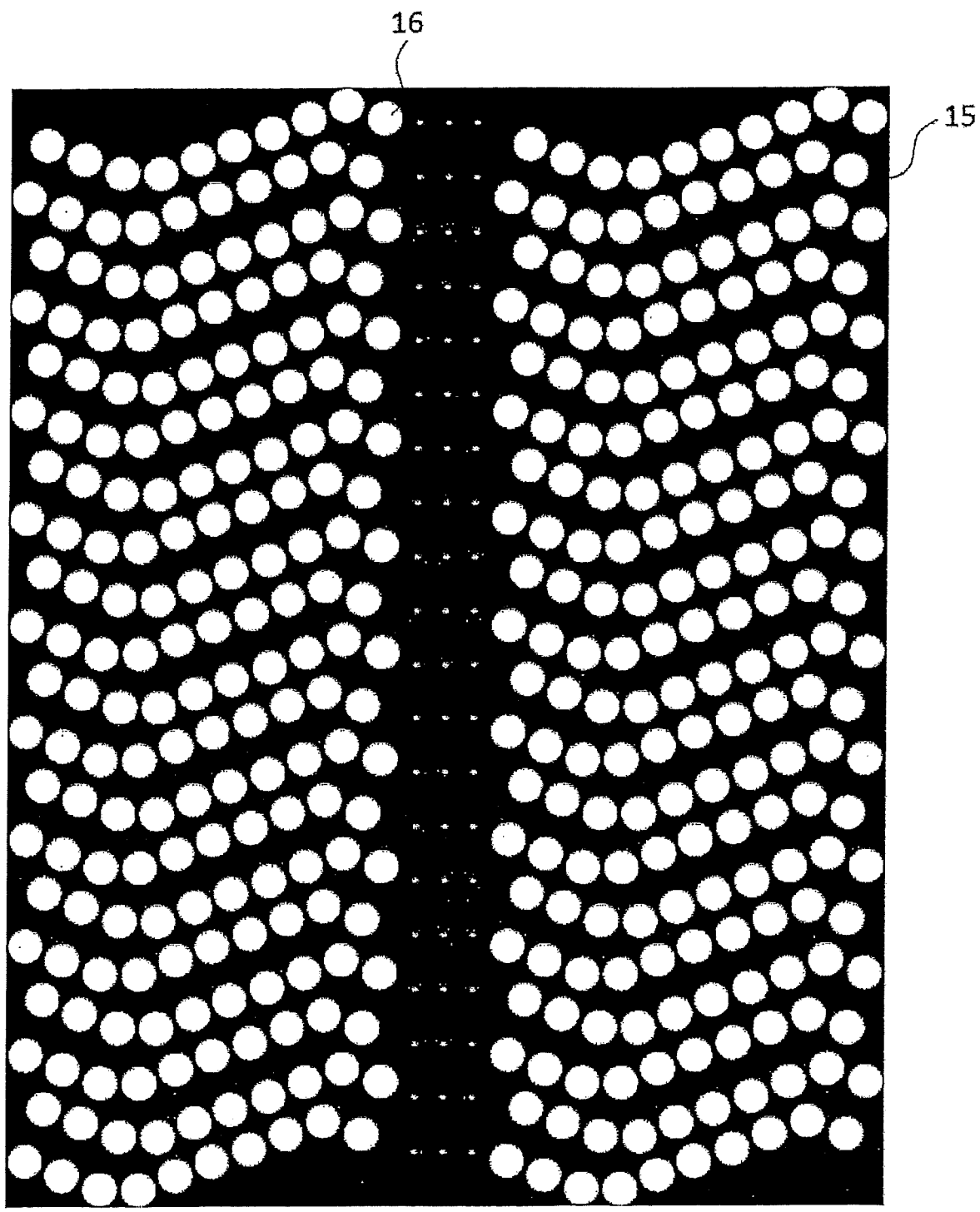
FIG. 10 is a diagram illustrating a configuration example of a projection mask pattern.

As an example of the projection mask pattern 15 in which at least some of the plurality of opening portions 16 are not on a straight line parallel to the moving direction of the glass substrate 30, for example, a projection mask pattern 15 in which one column of the opening portions 16 is on a substantially sine curve (sine wave) is possible. FIG. 10 illustrates a configuration example of the projection mask pattern 15 in which one column of the opening portions 16 is on a substantially sine curve (sine wave).

Meanwhile, the projection mask pattern 15 illustrated in FIG. 10 is an example, and the arrangement of the opening portions 16 is not limited to this example. For example, the opening portions 16 may be on a cosine curve (cosine wave) or a substantially cosine curve. In addition, each of the opening portions 16 is not necessarily on a sine curve or a cosine curve, and may be on a waveform having a predetermined period.

A laser beam passes through an opening (transmission region 16) of the projection mask pattern 15 illustrated in FIG. 10 and is emitted onto a predetermined region of an amorphous silicon thin film 21 by the projection lens 18. As a result, the predetermined region of the amorphous silicon thin film 21 is instantaneously heated and melted so that a portion of the amorphous silicon thin film 21 becomes a polysilicon thin film 22.

Also, in the third example, the laser irradiation device 10 emits the laser beam 14 at a predetermined cycle, moves the glass substrate 30 at a time when the laser beam 14 is not emitted, and emits the laser beam 14 onto a location of the next amorphous silicon thin film 21. Also, in the third example, as illustrated in FIG. 3, the amorphous silicon thin films 21 are on the glass substrate 30 with a predetermined interval "H" in a moving direction. In addition, the laser irradiation device 10 irradiates the portions of the amorphous silicon thin films 21 on the glass substrate 30 with the laser beam 14 at predetermined cycles.

Then the point, the projection lens 18 is used, the laser beam 14 is converted with a magnification of the optical system of the projection lens 18. That is, a pattern of the projection mask pattern 15 is converted with a magnification of the optical system of the projection lens 18, and laser annealing is performed on a predetermined region on the glass substrate 30.

That is, a mask pattern of the projection mask pattern 15 is converted with a magnification of the optical system of the projection lens 18, and laser annealing is performed on a predetermined region on the glass substrate 30. For example, when magnification of the optical system of the projection lens 18 is approximately twice, the mask pattern of the projection mask pattern 15 is approximately ½ (0.5) times, and laser annealing is performed on the predetermined region of the glass substrate 30. The magnification of the optical system of the projection lens 18 is not limited to approximately twice and may be any magnification. Regarding the mask pattern of the projection mask pattern 15, laser annealing is performed on the predetermined region of the glass substrate 30 in accordance with the magnification of the optical system of the projection lens 18. For example, when magnification of the optical system of the projection lens 18 is approximately four times, the mask pattern of the projection mask pattern 15 is approximately ¼ (0.25) times, and laser annealing is performed on the predetermined region of the glass substrate 30.

Further, when the projection lens 18 forms an inverted image, a reduced image of the projection mask pattern 15 formed on the glass substrate 30 by irradiation is a pattern rotated by 180 degrees around the optical axis of the lens of the projection lens 18. On the other hand, when the projection lens 18 forms an erect image, a reduced image of the projection mask pattern 15 formed on the glass substrate 30 by irradiation is the projection mask pattern 15 itself.

Meanwhile, in a single projection lens, for example, even when the amount of irradiation light and a magnification in a peripheral portion are different from those in a central portion due to the influence of aberration or the like, it is possible to realize uniform irradiation by changing a transmittance of a mask in the central portion and the peripheral portion of the projection mask pattern 15. For example, when the amount of irradiation light in a peripheral portion is smaller than that in a central portion in a single irradiation lens, it is possible to realize uniform irradiation in the entire projection mask pattern 15 by setting a high transmittance of the mask in the central portion of the projection mask pattern 15 and setting a transmittance of the mask in the peripheral portion to be lower than the transmittance in the central portion.

As described above, in the third example, even when laser annealing is performed using one projection lens 18, it is possible to irradiate the amorphous silicon thin films 21 adjacent to each other with the laser beams 14 having different transmittances. As a result, the thin-film transistors 20 adjacent to each other have different characteristics in the entire glass substrate 30, and thus a difference in display (for example, a difference in the shading of colors, or the like) due to the difference between the characteristics is not shown "linearly." For this reason, display unevenness does not become "stripes" on the liquid crystal screen, and thus it is possible to prevent the display unevenness from being emphasized.

When where the terms "vertical," "parallel," "planar," "perpendicular" and the like are used in the above description, these terms are not used in the extract meanings thereof. That is, the terms "vertical," "parallel," "planar" and "perpendicular" allow tolerances and errors in design and manufacturing and have meanings of "substantially vertical," "substantially parallel," "substantially planar" and "substantially perpendicular." Meanwhile, the tolerances and errors as used herein mean units in a scope without departing from the configurations, operations and desired effects.

Further, when terms "same," "equal," "different" and the like are used in relation to a dimension and a size of an external appearance in the above description, these terms are not used in the extract meanings thereof. That is, the terms "same," "equal" and "different" allow tolerances and errors in design and manufacturing and have meanings of "substantially same," "substantially equal" and "substantially different." Meanwhile, the tolerances and errors as used herein mean units in a scope without departing from the configurations, operations and desired effects.

While our devices, transistors and methods have been described on the basis of the accompanying drawings and examples, those skilled in the art can easily perform various modifications and corrections on the basis of this disclosure. Accordingly, such modifications and corrections are included in the scope of this disclosure. For example, functions and the like included in respective means and respective steps can be rearranged as long as there is no logical contradiction, two or more means or steps may be combined into a single means or step, or a single means or step may be divided. In addition, the configurations described in the above-mentioned examples may be appropriately combined.

The invention claimed is:

1. A laser irradiation device comprising:
   a light source that generates a laser beam;
   a projection lens that irradiates a predetermined region of an amorphous silicon thin film, mounted on each of a plurality of thin-film transistors on a glass substrate moving in a predetermined direction, with the laser beam; and
   a projection mask pattern provided on the projection lens and having a plurality of columns each including a predetermined number of opening portions and provided parallel to the predetermined direction,
   wherein the projection lens emits the laser beam through the projection mask pattern,
   the projection mask pattern is configured such that at least some of the predetermined number of opening portions are not on a straight line parallel to the predetermined direction in each of the plurality of columns, and
   the projection mask pattern is configured such that each of the predetermined number of opening portions is on a predetermined waveform having a predetermined period in each of the plurality of columns.

2. The laser irradiation device according to claim 1, wherein the projection mask pattern is configured such that each of the predetermined number of opening portions is on substantially a sine wave in each of the plurality of columns.

3. The laser irradiation device according to claim 1, wherein the projection lens is a microlens array having a plurality of columns, each including a predetermined number of microlenses and provided parallel to the predetermined direction, and
   the microlens array is configured such that at least some of the predetermined number of microlenses are not on a straight line parallel to the predetermined direction in each of the plurality of columns.

4. The laser irradiation device according to claim 3, wherein the microlens array is configured such that each of the predetermined number of microlenses is on a predetermined waveform having a predetermined period in each of the plurality of columns.

5. The laser irradiation device according to claim 3, wherein the microlens array is configured such that each of the predetermined number of microlenses is on substantially a sine wave in each of the plurality of columns.

6. The laser irradiation device according to claim 3, wherein microlenses adjacent to each other and included in one column are disposed to be shifted from each other by a predetermined distance in the microlens array, and
   the predetermined distance is a natural number multiple of an interval between the amorphous silicon thin films on the glass substrate.

7. The laser irradiation device according to claim 3, wherein the light source repeatedly irradiates the amorphous silicon thin films included in one column on the glass substrate with a laser beam a predetermined number of times using the microlens array.

8. The laser irradiation device according to claim 7, wherein the light source moves the microlens array in a direction perpendicular to the one column by a predetermined phase of the predetermined waveform whenever the amorphous silicon thin films included in the one column on the glass substrate are repeatedly irradiated with a laser beam.

9. The laser irradiation device according to claim 3, wherein the microlens forms a polysilicon thin film by irradiating a predetermined region of an amorphous silicon thin film mounted between a source electrode and a drain electrode included in a thin-film transistor with a laser beam.

10. The laser irradiation device according to claim 2, wherein the projection lens is a microlens array having a plurality of columns, each including a predetermined number of microlenses and provided parallel to the predetermined direction, and
    the microlens array is configured such that at least some of the predetermined number of microlenses are not on a straight line parallel to the predetermined direction in each of the plurality of columns.

11. The laser irradiation device according to claim 4, wherein the microlens array is configured such that each of the predetermined number of microlenses is on substantially a sine wave in each of the plurality of columns.

12. The laser irradiation device according to claim 4, wherein microlenses adjacent to each other and included in one column are disposed to be shifted from each other by a predetermined distance in the microlens array, and
    the predetermined distance is a natural number multiple of an interval between the amorphous silicon thin films on the glass substrate.

13. The laser irradiation device according to claim 5, wherein microlenses adjacent to each other and included in one column are disposed to be shifted from each other by a predetermined distance in the microlens array, and
    the predetermined distance is a natural number multiple of an interval between the amorphous silicon thin films on the glass substrate.

14. The laser irradiation device according to claim 4, wherein the light source repeatedly irradiates the amorphous silicon thin films included in one column on the glass substrate with a laser beam a predetermined number of times using the microlens array.

15. The laser irradiation device according to claim 5, wherein the light source repeatedly irradiates the amorphous silicon thin films included in one column on the glass substrate with a laser beam a predetermined number of times using the microlens array.

16. The laser irradiation device according to claim 6, wherein the light source repeatedly irradiates the amorphous silicon thin films included in one column on the glass substrate with a laser beam a predetermined number of times using the microlens array.

17. A thin-film transistor manufacturing method comprising:
    a first step of generating a laser beam; and
    a second step of irradiating a predetermined region of an amorphous silicon thin film, mounted on each of a plurality of thin-film transistors on a glass substrate moving in a predetermined direction, with the laser beam by a projection lens,
    wherein, in the second step, the laser beam is emitted using a projection mask pattern provided on the projection lens and has a plurality of columns, each including a predetermined number of opening portions and provided parallel to the predetermined direction,
    the projection mask pattern is configured such that at least some of the predetermined number of opening portions are not on a straight line parallel to the predetermined direction in each of the plurality of columns, and the projection mask pattern is configured such that each of the predetermined number of opening portions is on a predetermined waveform having a predetermined period in each of the plurality of columns.

18. A laser irradiation device comprising:

a light source that generates a laser beam;

a projection lens that irradiates a predetermined region of an amorphous silicon thin film, deposited between a source electrode and a drain electrode included in each of a plurality of thin-film transistors on a glass substrate moving in a predetermined direction, with the laser beam to form a polysilicon thin film; and a projection mask pattern provided on the projection lens and having a plurality of columns each including a predetermined number of opening portions and provided parallel to the predetermined direction such as each opening portion corresponds to one of the plurality of thin film transistors, wherein the projection lens emits the laser beam through the projection mask pattern, the projection mask pattern is configured such that at least some of the predetermined number of opening portions are not on a straight line parallel to the predetermined direction in each of the plurality of columns, and in the plurality of thin film transistors onto which the laser beam is radiated, the laser beams different from each other are radiated through the projection mask pattern onto corresponding amorphous silicon thin films adjacent to each other of the thin film transistors adjacent to each other.

* * * * *